(12) United States Patent
Goebel et al.

(10) Patent No.: US 6,579,729 B2
(45) Date of Patent: Jun. 17, 2003

(54) MEMORY CELL CONFIGURATION AND METHOD FOR FABRICATING IT

(75) Inventors: Bernd Goebel, Dresden (DE); Siegfried Schwarzl, Neubiberg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/956,164

(22) Filed: Sep. 19, 2001

(65) Prior Publication Data

US 2002/0064069 A1 May 30, 2002

Related U.S. Application Data

(63) Continuation of application No. PCT/DE00/00590, filed on Mar. 1, 2000.

(30) Foreign Application Priority Data

Mar. 19, 1999 (DE) .......................... 199 12 523

(51) Int. Cl.$^7$ ............................................. H01L 21/00
(52) U.S. Cl. ........................ 438/3; 257/145; 365/158; 365/173
(58) Field of Search ........................ 257/295; 438/3; 365/158, 173, 130

(56) References Cited

U.S. PATENT DOCUMENTS

| | | | |
|---|---|---|---|
| 3,972,059 A | 7/1976 | DiStefano | 257/30 |
| 5,640,343 A | 6/1997 | Gallagher et al. | 365/171 |
| 5,764,567 A * | 6/1998 | Parkin | 365/173 |
| 5,793,697 A * | 8/1998 | Scheuerlein | 365/230.07 |
| 5,838,608 A | 11/1998 | Zhu et al. | 365/158 |
| 5,841,692 A | 11/1998 | Gallagher et al. | 365/173 |
| 6,072,718 A * | 6/2000 | Abraham et al. | 365/173 |
| 6,114,719 A * | 9/2000 | Dill et al. | 257/295 |
| 6,285,581 B1 * | 9/2001 | Tehrani et al. | 365/173 |

FOREIGN PATENT DOCUMENTS

JP     10222817     8/1998

* cited by examiner

*Primary Examiner*—Trung Dang
(74) *Attorney, Agent, or Firm*—Laurence A. Greenberg; Werner H. Stemer; Ralph E. Locher

(57) ABSTRACT

Layers of metallic lines and layers of memory cells are disposed alternately one above the other. The memory cells each have a diode and a memory element connected in series therewith. The memory element has a layer structure with a magnetoresistive effect. The diode has a layer structure containing at least two metal layers and an insulating layer disposed in between. The layer structure of the memory element and the layer structure of the diode are disposed above one another. The metallic lines of a respective one of the layers run parallel to one another. The metallic lines of mutually adjacent layers run transversely with respect to one another.

7 Claims, 5 Drawing Sheets

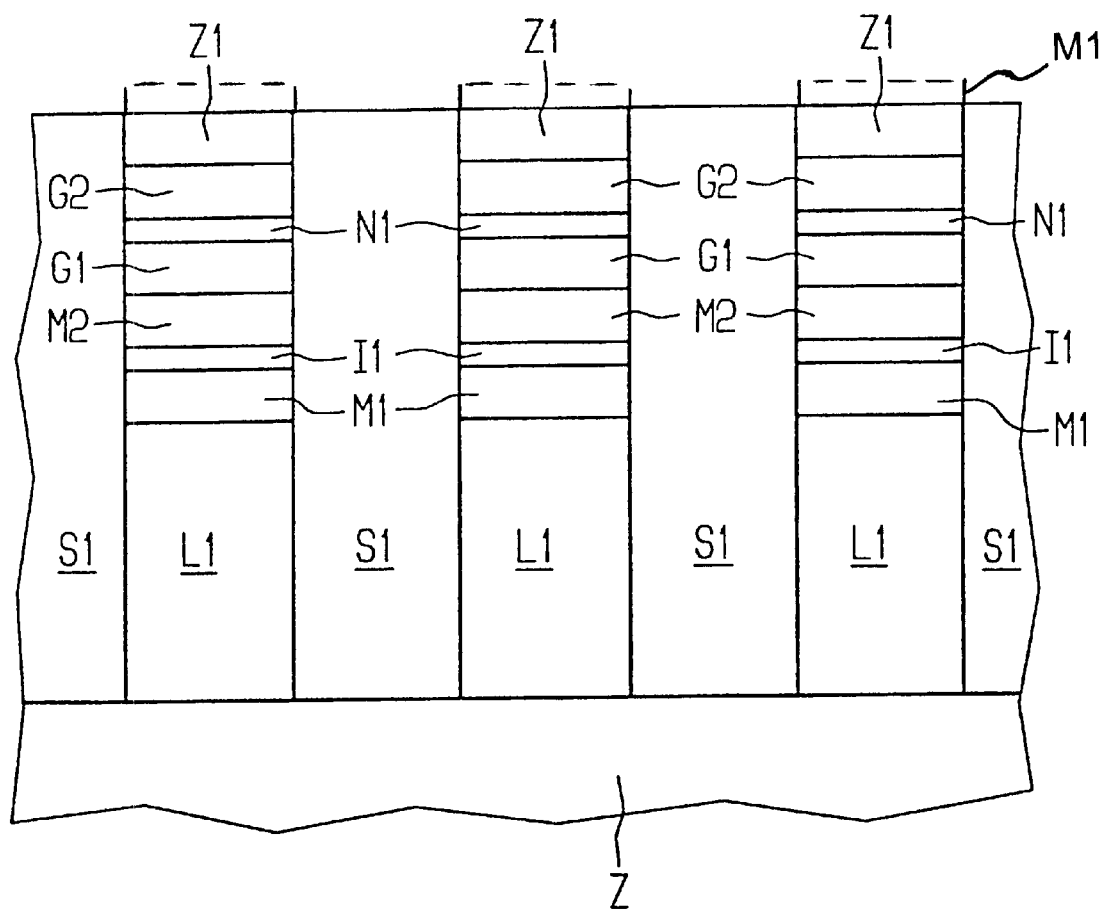

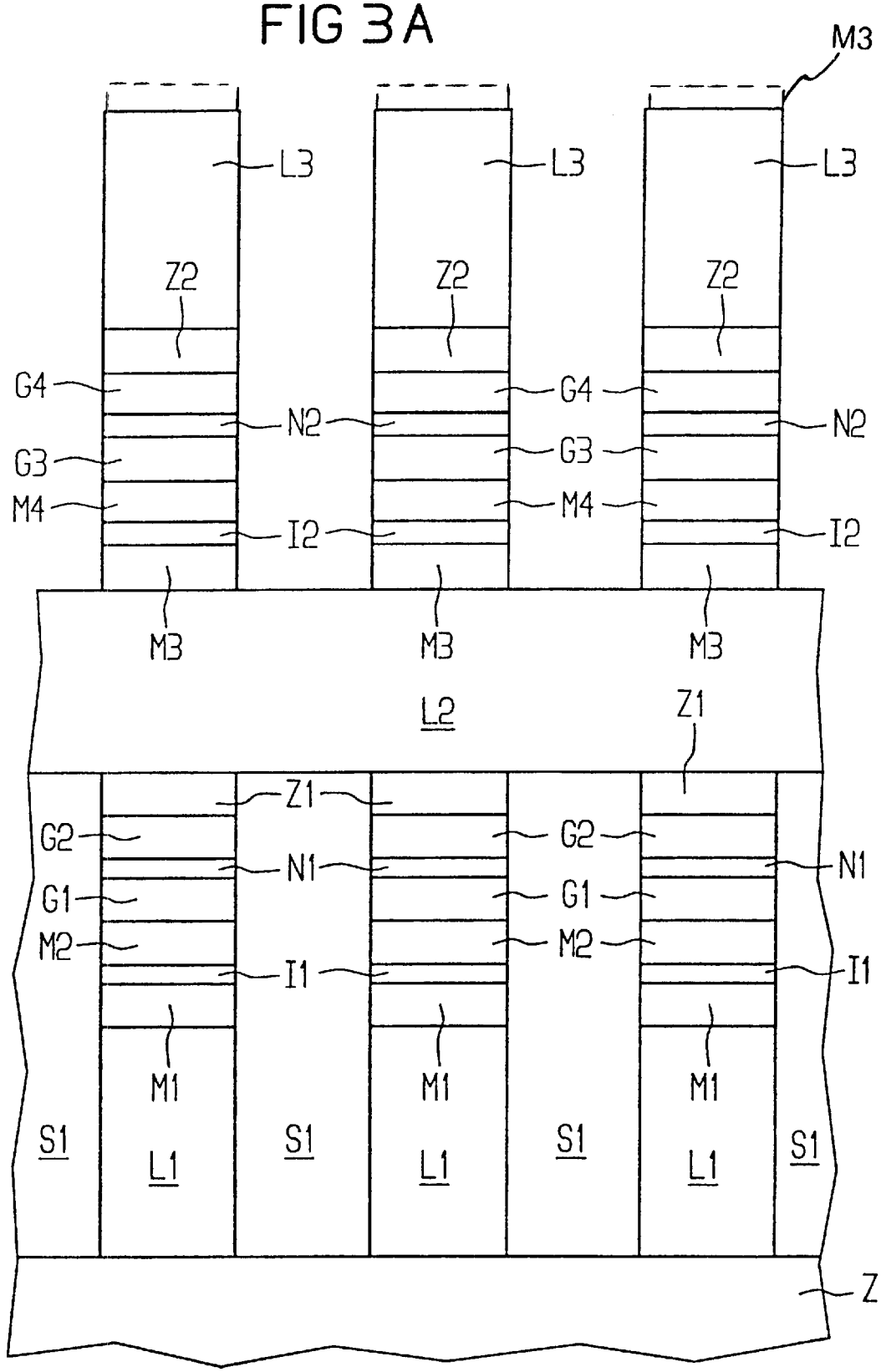

MEMORY CELL CONFIGURATION AND METHOD FOR FABRICATING IT

CROSS-REFERENCE TO RELATED APPLICATION

This application is a continuation of copending International Application No. PCT/DE00/00590, filed Mar. 1, 2000, which designated the United States.

BACKGROUND OF THE INVENTION

Field of the Invention

The invention relates to a memory cell configuration with memory elements having a layer structure with a magnetoresistive effect.

Layer structures with a magnetoresistive effect are known from the technology analysis titled "XMR-Technologien, Technologiefrüherkennung [XMR Ttechnologies, Technology Detection At An Early Stage]", author Stefan Mengel, published by VDI Technologiezentrum Physikalische Technologien. Depending on the construction of the layer structure, a distinction is made between a giant magnetoresistance (GMR) element, a tunneling magnetoresistance (TMR) element, an anisotropic magnetoresistance (AMR) element and a colossal magnetoresistance (CMR) element.

The term GMR element is used by experts for layer structures that have at least two ferromagnetic layers and a nonmagnetic, conductive layer disposed in between and exhibit the so-called giant magnetoresistance effect, that is to say a large magnetoresistive effect in comparison with the anisotropic magnetoresistance effect. The GMR effect encompasses the fact that the electrical resistance of the GMR element is dependent on whether the magnetizations in the two ferromagnetic layers are oriented in a parallel or antiparallel manner.

Tunneling magnetoresistance layer structures have at least two ferromagnetic layers and an insulating, nonmagnetic layer disposed in between. In this case, the insulating layer is so thin that a tunneling current occurs between the two ferromagnetic layers. The layer structures likewise exhibit a magnetoresistive effect that is caused by a spin-polarized tunneling current through the insulating, nonmagnetic layer disposed between the two ferromagnetic layers. In this case, too, the electrical resistance of the TMR element is dependent on whether the magnetizations in the two ferromagnetic layers are oriented in a parallel or antiparallel manner.

The AMR effect is manifested in the fact that the resistance in magnetized conductors is different parallel and perpendicular to the magnetization direction. It is a volume effect and thus occurs in single ferromagnetic layers.

A further magnetoresistance effect, which is called a colossal magnetoresistance effect because of its magnitude ($\Delta R/R = 100$ to $400\%$ at room temperature), requires a high magnetic field for changing over between the magnetization states on account of its high coercive forces.

U.S. Pat. No. 5,640,343 describes a so-called magnetoresistive random access memory (MRAM) cell configuration in which memory cells are disposed between two layers of metallic lines disposed one above the other. The memory cells each have a diode and a memory element connected in series therewith. The memory element has a layer structure with a magnetoresistive effect. The diode is a pn diode or a Schottky diode which contains silicon. The layer structure of the memory element and the layer structure of the diode are disposed above one another. The metallic lines of the first layer run parallel to one another. The metallic lines of the second layer run parallel to one another and perpendicularly to the metallic lines of the first layer. The memory cells are in each case connected between a metallic line of the first layer and a metallic line of the second layer. The layer structure of the memory element contains two ferromagnetic layers and an insulating layer disposed in between. The electrical resistance of the memory element depends on whether the magnetization directions of the two ferromagnetic layers are parallel or antiparallel to one another. In order to write an information item to a memory cell, currents are impressed on the metallic lines that are connected to the memory cell. In this case, voltages are chosen such that no current flows through the memory cell. The magnetic fields generated by the currents accumulate in the region of the memory cell in such a way that the magnetization of one of the two magnetic layers is oriented in the magnetic field. The magnetization direction of the other ferromagnetic layer remains unchanged. The orientation represents the information item. In order to read out the information item, the voltage of the metallic line that is connected to the diode is lowered and the voltage on the metallic line that is connected to the memory element is increased. The same voltage is present on metallic lines that are connected to the remaining memory elements as on the metallic line which is connected to the diode of the memory cell to be read. The same voltage is present on the metallic lines that are connected to the remaining diodes as on the metallic line which is connected to the memory element of the memory cell to be read. On account of the diodes in the memory cells, current can only flow through the memory cell to be read. The current has two discrete values depending on the information stored on the memory cell, which values correspond to two magnetization states of the memory element.

SUMMARY OF THE INVENTION

It is accordingly an object of the invention to provide a memory cell configuration and a method for fabricating it which overcomes the above-mentioned disadvantages of the prior art devices and methods of this general type, which can be fabricated with an increased packing density in comparison with the prior art.

With the foregoing and other objects in view there is provided, in accordance with the invention, a memory cell configuration. The memory cell configuration contains at least three layers of metallic lines, and two layers of memory cells disposed in conjunction with the metallic lines alternately one above another. The memory cells each have a diode and a memory element connected in series with the diode. The memory element has a layer structure with a magnetoresistive effect. The diode has a layer structure containing at least two metal layers and an insulating layer disposed in between the two metal layers. The layer structure of the memory element and the layer structure of the diode are disposed above one another. The metallic lines in each of the three layers run parallel to one another. The metallic lines of mutually adjacent ones of the three layers run transversely with respect to one another, and the memory cells are in each case connected between one of the metallic lines of one of the three layers and one of the metallic lines of an adjacent one of the three layers.

The problem is furthermore solved by a method for fabricating a memory cell configuration, in which a first layer of metallic lines that run parallel to one another is produced. A first layer of memory cells is produced above the first layer of metallic lines in such a way that the memory cells of the first layer are connected to the metallic lines of the first layer. A memory element and a diode connected in series therewith are in each case produced for the memory cells of the first layer. For the diode, a layer structure is produced which contains at least two metal layers and an insulating layer disposed in between. A layer structure with a magnetoresistive effect is produced for the memory element. The layer structure of the memory element and the layer structure of the diode are produced above one another. A second layer of metallic lines, which run parallel to one another and transversely with respect to the metallic lines of the first layer, is produced above the first layer of memory cells in such a way that the memory cells of the first layer are in each case connected between a metallic line of the first layer and a metallic line of the second layer. Memory cells of a second layer that are constructed in accordance with the memory cells of the first layer are produced above the second layer of metallic lines. A third layer of metallic lines, which run parallel to one another and transversely with respect to the metallic lines of the second layer, is produced above the second layer of memory cells in such a way that the memory cells of the second layer are in each case connected between a metallic line of the second layer and a metallic line of the third layer.

Since the memory cells are disposed in at least two layers stacked one above the other, the area requirement per memory to element decreases and the packing density of the memory cell configuration is increased. The greater the number of layers of memory cells which are stacked one above the other, the higher the packing density which can be achieved. In this case, each layer of memory cells is disposed between two layers of metallic lines. The metallic lines of one layer run transversely with respect to the metallic lines of the other layer. The metallic lines can each be fabricated with minimum dimensions and spacings of a minimum feature size F which can be fabricated in the technology used, resulting in an area requirement per memory cell of $4F^2$ per layer. Overall, an area requirement of $4F^2/n$ per memory cell is produced in the memory cell configuration given n layers.

The diode is a tunnel diode in which electrons tunnel through the insulating layer more easily in one direction than in the other. High temperatures that could destroy metallic lines situated under the diode are not necessary for producing the diode.

The provision of the diodes prevents the situation where, during the read-out of information of a memory cell of a layer, currents flow through memory cells of a layer adjacent to this layer. Furthermore, the provision of the diodes has the effect that a current flows exclusively through the memory cell to be read between the metallic lines that are connected to the memory cell to be read. This is advantageous since the magnitude of the current is thereby independent of information items stored on other memory cells and only represents the information item to be read out.

The process outlay for producing the memory cell configuration is particularly low if a mask for producing the metallic lines of one layer and a mask for producing the metallic lines of an adjacent layer simultaneously serve for producing the memory cells disposed between these layers of metallic lines.

By way of example, a first conductive layer and, above the latter, layers for producing the first layer of memory cells are produced. The layers for producing the first layer of memory cells and the first conductive layer are patterned with the aid of a strip-type first mask in such a way that the first layer of metallic lines is produced from the first layer. Afterward, an insulating material is deposited and planarized, thereby producing mutually separate strip-type first insulating structures.

A second conductive layer and layers for producing the second layer of memory cells are applied. The layers for producing the second layer of memory cells, the second conductive layer and the layers for producing the first layer of memory cells are patterned with the aid of a strip-type second mask in such a way that the second layer of metallic lines is produced from the second layer, and that the memory cells of the first layer are produced from the layers for producing the first layer of memory cells. The memory cells of the first layer are consequently produced in two steps by patterning the corresponding layers. The first step takes place in the production of the first layer of metallic lines and the second step takes place in the production of the second layer of metallic lines. Afterward, an insulating material is deposited and planarized, thereby producing mutually separate strip-type second insulating structures.

Afterward, a third conductive layer is applied. The third conductive layer and the layers for producing the second layer of memory cells are patterned in a strip-type manner in such a way that the third layer of metallic lines is produced from the third layer, and that the memory cells of the second layer are produced from the layers for producing the second layer of memory cells. The memory cells of the second layer are consequently produced by patterning the corresponding layers in two process steps. The first step takes place in the production of the second layer of metallic lines and the second step takes place in the production of the third layer of metallic lines. In this way, it is possible to produce as many layers of memory cells and metallic lines as desired.

Particularly good electrical properties of the diode can be achieved if the difference between the work function of one metal layer and the work function of the other metal layer is as large as possible. In this case, the asymmetry of the tunnel effects in the diode is particularly large, i.e. electrons tunnel significantly more easily in one direction than in the other. Aluminum has a particularly low work function. Consequently, one metal layer is preferably composed of aluminum. However, other materials having a low work function are likewise suitable. The other metal layer is preferably composed of platinum, since platinum has a particularly high work function. However, other materials having a high work function, such as e.g. tungsten, are likewise suitable.

In order to produce the insulating layer, the aluminum can be oxidized.

The metallic lines may be composed, for example, of Cu, AlSiCu or metal silicide.

In order to simplify the process, it is advantageous if one of the two metal layers of the diode is part of one of the metallic lines. In this case, the metallic lines are preferably composed of aluminum.

A diffusion barrier made of TiN, for example, may be disposed between the layer structure of the diode and the layer structure of the memory element.

All known TMR elements and GMR elements are suitable as memory elements. Furthermore, all XMR elements are suitable which have two magnetization states with a different resistance, between which it is possible to switch back and forth by application of a magnetic field whose magnitude is acceptable for the memory application.

Preferably, the layer structure of the memory element at least contains two magnetic layers and a nonmagnetic layer disposed in between. The memory elements each have two magnetization states.

The nonmagnetic layer is preferably an insulating layer (TMR element) because this makes it possible to achieve higher element resistances (=100 kΩ), which are more favorable with regard to power consumption and signal/noise ratio. Examples of suitable materials for the magnetic layers are Ni, Fe, Co, Cr, Mn, Gd, Dy and alloys thereof, such as NiFe, NiFeCo, CoFe, CoCrFe, and MuBi, BiFe, CoSm, CoPt, CoMnB, CoFeB. Examples of suitable insulating materials for the nonmagnetic layer are $Al_2O_3$, MgO, NiO, $HfO_2$, $TiO_2$, NbO, $SiO_2$ and DLC (diamond-like carbon). Examples of suitable conductive materials for the nonmagnetic layer are Cu or Ag.

The thickness of the magnetic layers is preferably between 5 nm and 10 nm. The thickness of the nonmagnetic layer preferably lies in the range between 1 nm and 3 nm. The memory elements preferably have dimensions in the range between 50 nm and 150 nm. They can have, inter alia, a square or elongate configuration.

In order to increase the process reliability of the method, it is advantageous to dispose an intermediate layer between the layer structure of the memory cell and a metallic line disposed thereon. The intermediate layer prevents damage to the layer structures of the memory cell during the planarization of the insulating material for the purpose of producing the insulating structures. During the planarization, the intermediate layer is uncovered and can also be removed somewhat. Furthermore, the intermediate layer can simultaneously act as a diffusion barrier.

The layer structure of the memory elements may be disposed on the layer structure of the diode. As an alternative, the layer structure of the diode is disposed on the layer structure of the memory element.

One possible method of operation of the memory cell configuration is described below.

In order to write information to a memory cell, currents are impressed on the metallic lines connected to the memory cell. A magnetic field generated as a result is larger in the region of the memory cell than in regions of the remaining memory cells. In the region of the memory cell, the magnetic field is so large that the magnetization of the magnetically softer of the two magnetic layers of the associated memory element is oriented in the magnetic field. The magnetization direction of the magnetically harder of the two magnetic layers remains unchanged. The magnetic field is set in accordance with the information to be written such that the magnetization direction of the magnetically soft layer is parallel or antiparallel to the magnetization direction of the magnetically hard layer. Consequently, the memory cell can assume two different magnetization states.

In order to read out the information of the memory cell, voltages are applied to the associated metallic lines in such a way that a current flows through the memory cell. The magnitude of the current is dependent on the magnetization state of the memory cell, and is consequently dependent on the stored information.

Other features which are considered as characteristic for the invention are set forth in the appended claims.

Although the invention is illustrated and described herein as embodied in a memory cell configuration and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, cross-sectional view through a substrate with an intermediate oxide after a production of a first layer of metallic lines, a first metal layer, an insulating layer, a second metal layer, a first magnetic layer, a nonmagnetic layer, a second magnetic layer, a first intermediate layer and first insulating structures according to the invention;

FIG. 3a is a cross-sectional through the substrate after the production of a third layer of metallic lines.

DESCRIPTION OF THE PREFERRED EMBODIMENTS

Figure 2A:
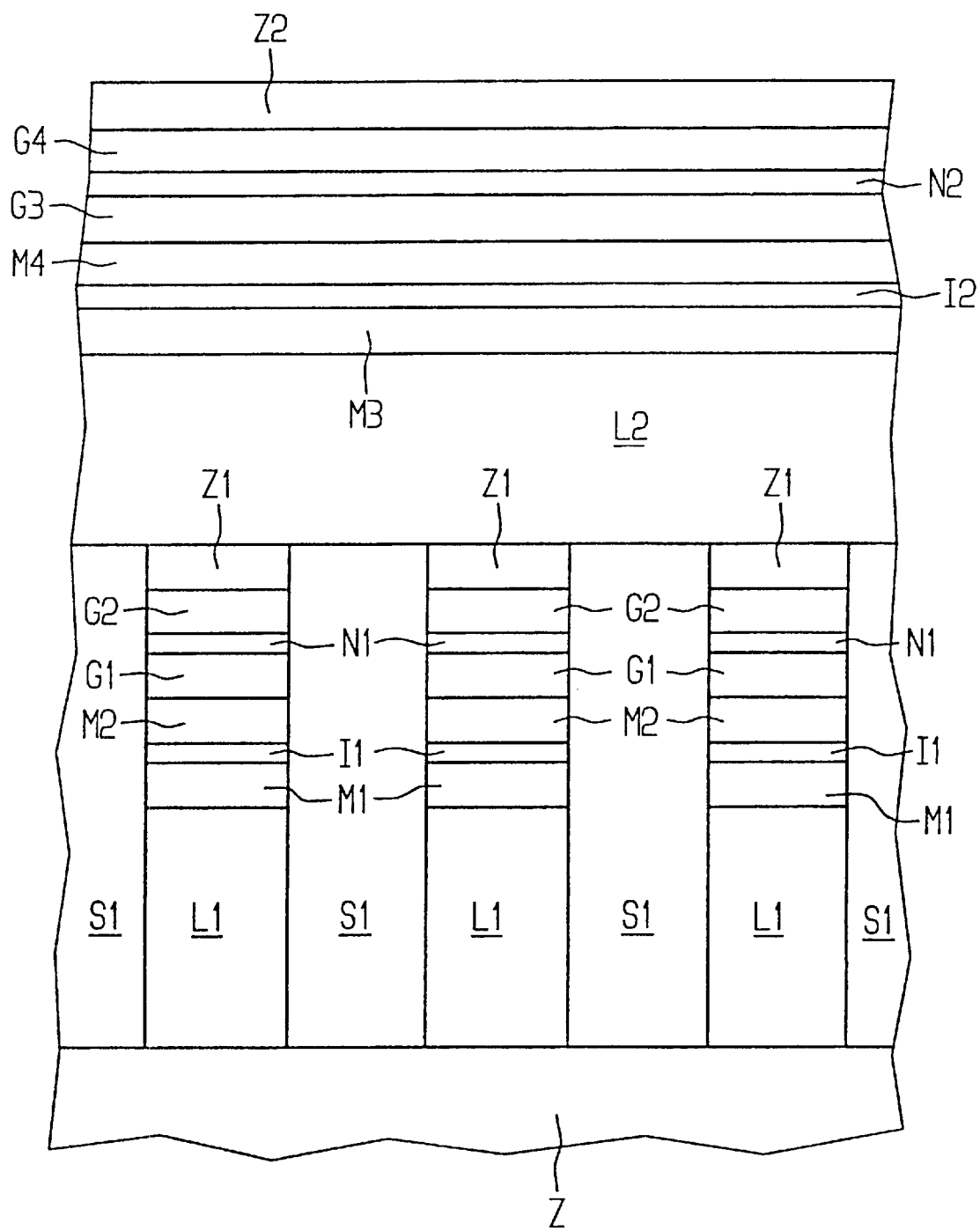
FIG. 2a is a cross-sectional view after the production of a second layer of metallic lines, a third metal layer, a second insulating layer, a fourth metal layer, a third magnetic layer, a second nonmagnetic layer, a fourth magnetic layer, a second intermediate layer and second insulating structures.

In all the figures of the drawing, sub-features and integral parts that correspond to one another bear the same reference symbol in each case. Referring now to the figures of the drawing in detail and first, particularly, to FIG. 1 thereof, there is shown an exemplary embodiment of a substrate provided in which non-illustrated semiconductor components are disposed and which is covered by an intermediate oxide Z. The semiconductor components may be part of a periphery of a memory cell configuration to be produced.

In order to produce a first conductive layer, copper is deposited to a thickness of approximately 500 nm for producing a first layer of metallic lines L1. In order to produce a first metal layer M1, aluminum is deposited to a thickness of approximately 10 nm. A first insulating layer I1 made of aluminum oxide and having a thickness of approximately 3 nm is produced by thermal oxidation. In order to produce a second metal layer M2, platinum is deposited to a thickness of approximately 10 nm. Afterward, a non-illustrated first diffusion barrier made of titanium nitride and having a thickness of approximately 10 nm is deposited. In order to produce a first magnetic layer G1, cobalt is deposited to a thickness of approximately 10 nm. In order to produce a first nonmagnetic layer N1 having a thickness of approximately 3 nm, aluminum is deposited and oxidized by thermal oxidation. In order to produce a second magnetic layer G2, NiFe is deposited to a thickness of approximately 10 nm. In order to produce a first intermediate layer Z1, titanium nitride is deposited to a thickness of approximately 20 nm (see FIG. 1).

With the aid of a strip-type first photoresist mask M1, whose strips have a width of approximately 150 nm and are spaced apart from one another by approximately 150 nm, the first intermediate layer Z1, the second magnetic layer G2, the first nonmagnetic layer N1, the first magnetic layer G1, the first diffusion barrier, the second metal layer M2, the first insulating layer I1 and the first metal layer M1 are etched by sputtering with argon. The copper layer is subsequently etched using, for example, BCl₃+Cl₂+CH₄, with the result that the first layer of metallic lines L1 is produced from the first conductive layer (see FIG. 1). The first photoresist mask M1 is removed.

In order to produce first insulating structures S1, SiO₂ is deposited to a thickness of approximately 100 nm and planarized by chemical mechanical polishing until the first intermediate layer Z1 is uncovered (see FIG. 1). The first intermediate layer Z1 is removed by approximately 10 nm in the process.

Figure 2B:
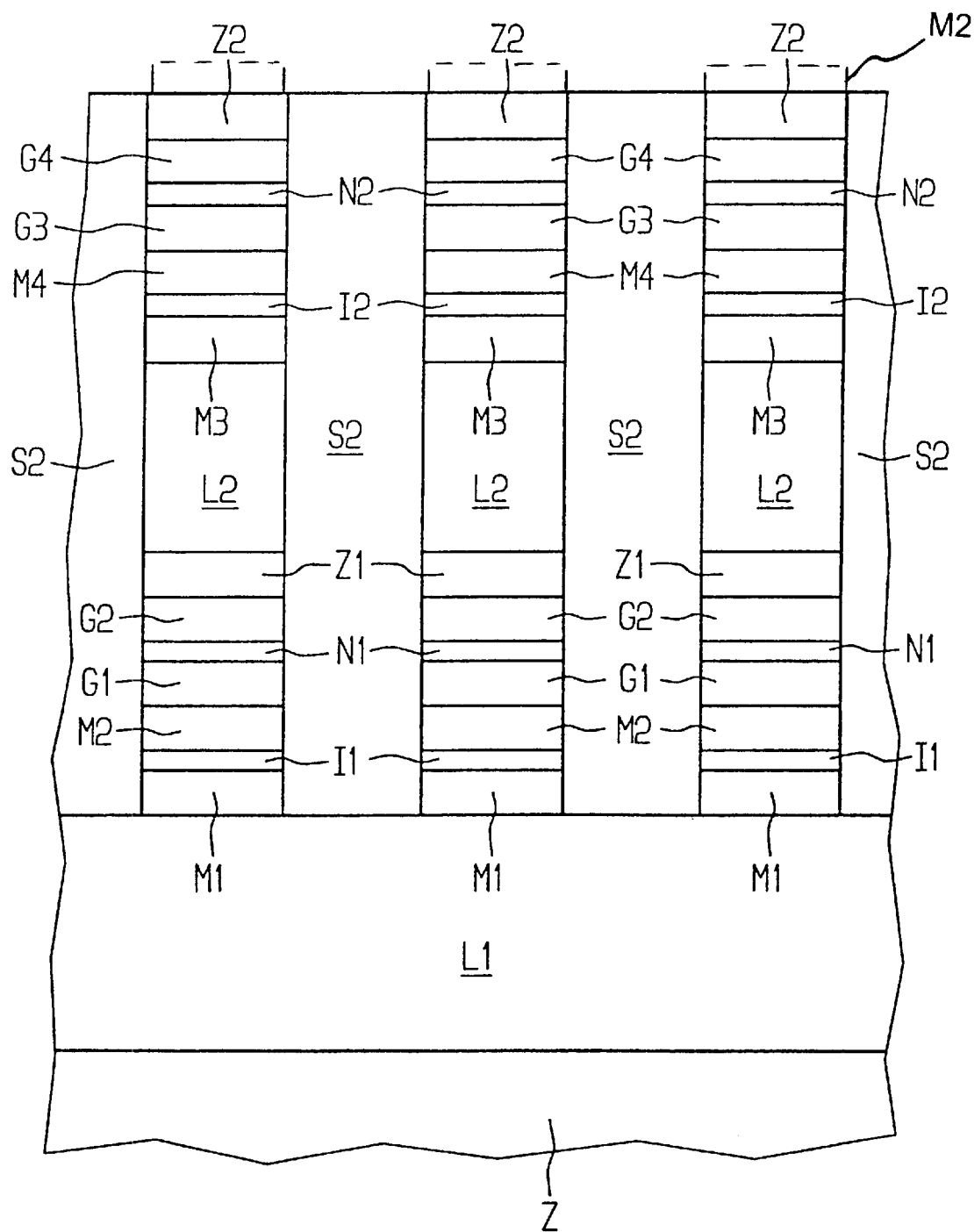
FIG. 2b is a cross-sectional view, perpendicular to the cross section shown in FIG. 2a, through the substrate after the process steps shown in FIG. 2a are performed.

In order to produce a second conductive layer, copper is deposited to a thickness of approximately 500 nm for forming a second layer of conductive lines L2. In order to produce a third metal layer M3, aluminum is deposited to a thickness of approximately 10 nm. A second insulating layer I2 made of aluminum oxide and having a thickness of approximately 3 nm is produced by thermal oxidation. In order to produce a fourth metal layer M4, platinum is deposited to a thickness of approximately 10 nm. In order to produce a non-illustrated second diffusion barrier, titanium nitride is deposited to a thickness of approximately 10 nm. In order to produce a third magnetic layer G3, cobalt is deposited to a thickness of approximately 10 nm. In order to produce a second nonmagnetic layer N2 having a thickness of approximately 3 nm, aluminum is deposited and oxidized by thermal oxidation. In order to produce a fourth magnetic layer G4, NiFe is deposited to a thickness of approximately 10 nm. In order to produce a second intermediate layer Z2, TiN is deposited to a thickness of approximately 20 nm (see FIGS. 2a and 2b).

With the aid of a second strip-type photoresist mask M2, whose strips have a width of approximately 150 nm, run transversely with respect to the strips of the first photoresist mask M1 and are spaced apart from one another by approximately 150 nm, the second intermediate layer Z2, the fourth magnetic layer G4, the second nonmagnetic layer N2, the third magnetic layer G3, the second diffusion barrier, the fourth metal layer M4, the second insulating layer I2 and the third metal layer M3 are etched by sputtering with argon. The second conductive layer is subsequently etched using, for example, BCl₃+Cl₂+CH₄, with the result that the second layer of metallic lines L2 is produced (see FIGS. 2a and 2b).

Afterward, the first intermediate layer Z1, the second magnetic layer G2, the first nonmagnetic layer N1, the first magnetic layer G1, the first diffusion barrier, the second metal layer M2, the first insulating layer I1 and the first metal layer M1 are etched by sputtering with argon. As a result, mutually separate layer structures of memory elements of a first layer of memory cells are produced from the second magnetic layer G2, the first nonmagnetic layer N1 and the first magnetic layer G1. Layer structures of diodes of the first layer of memory cells are produced from the second metal layer M2, the first insulating layer I1 and the first metal layer M1. A memory cell of the first layer contains a diode and a memory element whose layer structures are disposed above one another.

The second photoresist mask M2 is removed.

In order to produce second insulating structures S2, SiO₂ is deposited to a thickness of approximately 100 nm and planarized by chemical mechanical polishing until the second intermediate layer Z2 is uncovered. The second intermediate layer Z2 is removed by approximately 10 nm in the process.

In order to produce a third conductive layer, copper is deposited to a thickness of approximately 500 nm.

Figure 3B:
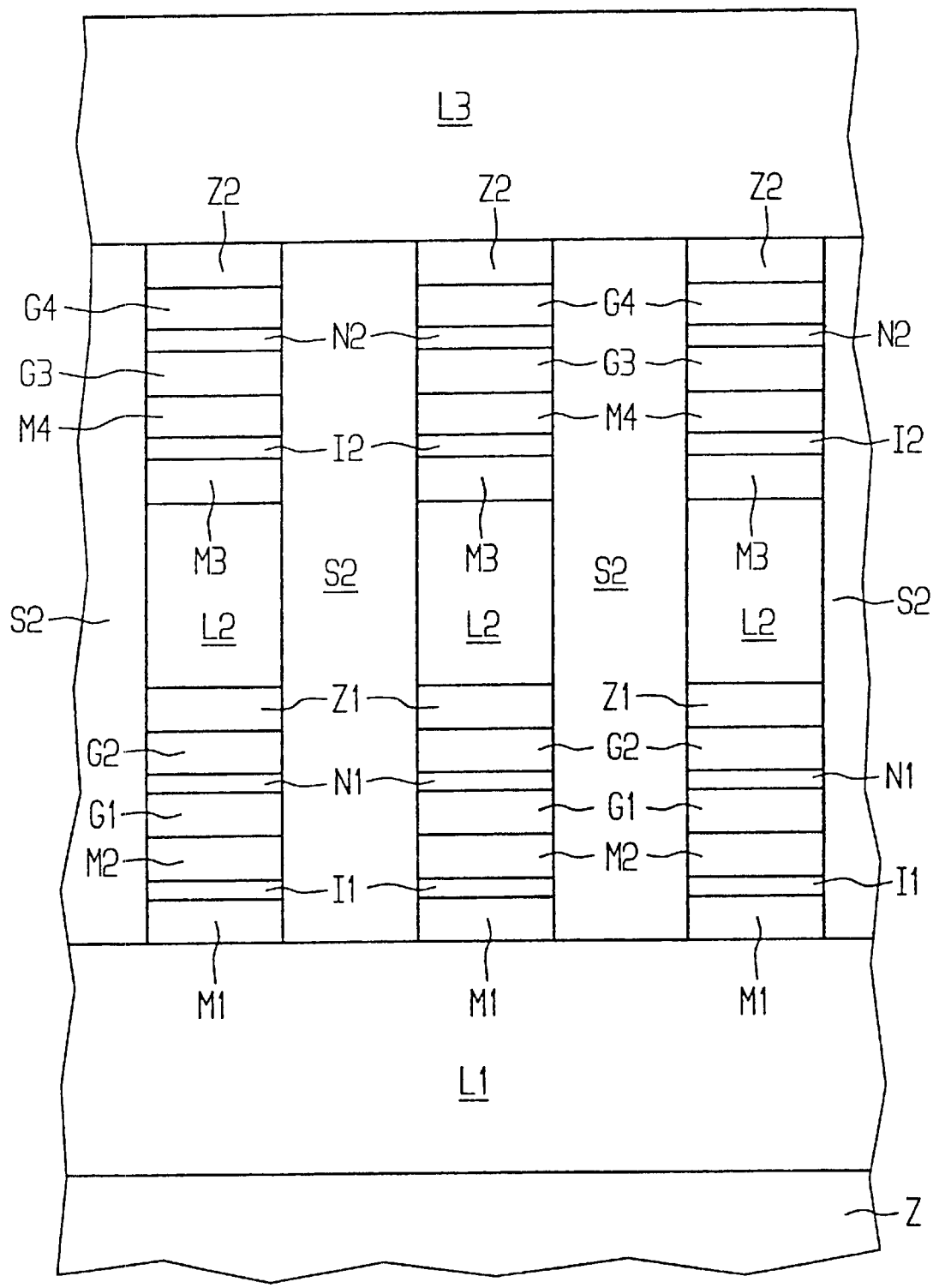
FIG. 3b is a cross-sectional view, perpendicular to the cross section shown in FIG. 3a, through the substrate after the process steps shown in FIG. 3a are performed.

With the aid of a third strip-type photoresist mask M3, which corresponds to the first photoresist mask M1, copper is etched R using, for example, BCl₃+CO₂+CH₄, with the result that a third layer of metallic lines L3 is produced from the third conductive layer (see FIGS. 3a and 3b).

Afterward, the second intermediate layer Z2, the fourth magnetic layer G4, the second nonmagnetic layer N2, the third magnetic layer G3, the second diffusion barrier, the fourth metal layer M4, the second insulating layer I2 and the third metal layer M3 are etched by sputtering with argon. As a result, mutually separate layer structures of memory elements of a second layer of memory cells are produced from the fourth magnetic layer G4, the second nonmagnetic layer N2 and the third magnetic layer G3. Layer structures of the diodes of the memory cells of the second layer are produced from the fourth metal layer M4, the second insulating layer I2 and the third metal layer M3. A memory cell of the second layer contains a diode and a memory element whose layer structures are disposed above one another.

The method produces an MRAM memory cell configuration with two layers of memory cells disposed one above the other.

There are many conceivable variations of the exemplary embodiment that likewise lie within the scope of the invention. In particular, dimensions of the layers and masks described can be adapted as desired to the respective requirements. The same applies to the choice of materials.

The metallic lines L1, L2, L3 can be produced from aluminum instead of from copper. In this case, parts of the metallic lines act as lower metal layers of the diodes. The production of separate metal layers M1, M3 can be dispensed with.

It is possible to produce more than three layers of metallic lines and more than two layers of memory cells which are disposed alternately one above the other.

We claim:

1. A memory cell configuration, comprising:
    at least three layers of metallic lines; and
    two layers of memory cells disposed in conjunction with said metallic lines alternately one above another, said memory cells each having a diode and a memory element connected in series with said diode, said memory element having a layer structure with a magnetoresistive effect, said diode having a layer structure containing at least two metal layers and an insulating layer disposed in between said two metal layers, said layer structure of said memory element and said layer structure of said diode disposed above one another;
    said metallic lines in each of said three layers run parallel to one another, said metallic lines of mutually adjacent ones of said three layers run transversely with respect to one another, and said memory cells are in each case connected between one of said metallic lines of one of said three layers and one of said metallic lines of an adjacent one of said three layers.

2. The memory cell configuration according to claim 1, wherein said two metal layers of said diode form part of one of said metallic lines.

3. The memory cell configuration according to claim 1, wherein said layer structure of said memory element at least contains two magnetic layers and a nonmagnetic layer disposed in between said two magnetic layers.

4. A method for producing a memory cell configuration, which comprises the steps of:
    producing a first layer of metallic lines running parallel to one another;
    producing a first layer of memory cells above the first layer of metallic lines in such a way that the memory cells of the first layer are connected to the metallic lines of the first layer, the memory cells are produced by the given steps of:

producing a layer structure containing at least two metal layers and an insulating layer disposed in between the two metal layers for forming a diode;

producing a layer structure with a magnetoresistive effect for forming a memory element;

producing the layer structure of the memory element and the layer structure of the diode above one another and connecting the memory element and the diode in series for forming each of the memory cells;

producing a second layer of metallic lines running parallel to one another and transversely with respect to the metallic lines of the first layer, above the first layer of memory cells in such a way that the memory cells of the first layer are in each case connected between a metallic line of the first layer and a metallic line of the second layer;

producing a second layer of memory cells in which the memory cells of the second layer are constructed in accordance with the given steps for forming the memory cells of the first layer, the second layer of memory cells formed above the second layer of metallic lines; and producing a third layer of metallic lines running parallel to one another and transversely with respect to the metallic lines of the second layer, above the second layer of memory cells such that the memory cells of the second layer are in each case connected between a metallic line of the second layer and a metallic line of the third layer.

5. The method according to claim 4, which comprises:

producing a first conductive layer and, above the first conductive layer, producing layers for forming the first layer of memory cells;

patterning the layers for producing the first layer of memory cells and the first conductive layer with the aid of a first strip-type mask such that the first layer of metallic lines is produced from the first conductive layer;

depositing and then planarizing an insulating material thereby producing mutually separate strip-type first insulating structures;

producing a second conductive layer and, above the second conductive layer, producing layers for forming the second layer of memory cells;

patterning the layers for producing the second layer of memory cells, the second conductive layer and the layers for producing the first layer of memory cells with the aid of a strip-type second mask such that the second layer of metallic lines is formed from the second conductive layer, and that the memory cells of the first layer are produced from the layers for producing the first layer of memory cells;

depositing and planarizing a further insulating material thereby producing mutually separate strip-type second insulating structures, applying a third conductive layer; and patterning the third conductive layer and the layers for producing the second layer of memory cells with an aid of a strip-type third mask such that the third layer of metallic lines is produced from the third conductive layer, and that the memory cells of the second layer are produced from the layers for producing the second layer of memory cells.

6. The method according to claim 4, which comprises producing one of the two metal layers of the diode as part of one of the metallic lines.

7. The method according to claim 4, which comprises producing at least two magnetic layers and a nonmagnetic layer disposed in between the two magnetic layer for forming the layer structure of the memory element.

* * * * *